United States Patent [19]

Shieber et al.

[11] Patent Number: 4,743,710
[45] Date of Patent: May 10, 1988

[54] COAXIAL INTERCONNECTION BOARDS

[75] Inventors: Leonard Shieber; J. Philip Plonski, both of Huntington; Michael Vignola, Bayville; Benjamin G. Chin, Westbury, all of N.Y.

[73] Assignee: Kollmorgen Technologies Corporation, Dallas, Tex.

[21] Appl. No.: 788,834

[22] Filed: Oct. 18, 1985

[51] Int. Cl.⁴ .............................................. H05K 1/00
[52] U.S. Cl. ..................................... 174/68.5; 361/397
[58] Field of Search ....................... 174/68.5; 333/243; 361/397, 398

[56] References Cited

U.S. PATENT DOCUMENTS 3,659,340  5/1972  Giedd et al. ................. 174/68.5 X
3,872,236  3/1975  Swengel, Sr. et al. ............ 174/68.5
3,996,416  12/1976  Lemke ............................ 174/68.5

Primary Examiner—Morris H. Nimmo
Attorney, Agent, or Firm—Morgan & Finnegan

[57] ABSTRACT

In making coaxial interconnection boards according to this invention coaxial conductors are scribed onto a circuit board substrate. The coaxial conductors are preformed and affixed in a predetermined pattern on the substrate using an adhesive. A conductive layer forming a ground plane covers the surface of the substrate interconnecting the shields of the coaxial conductors. The conductive material other than the coaxial signal conductors is eliminated around the termination points of the coaxial conductors thereby creating clearance areas. The clearance areas permit connection of the signal conductors to surface terminal pads without shorting to the shield conductors or ground planes.

5 Claims, 4 Drawing Sheets

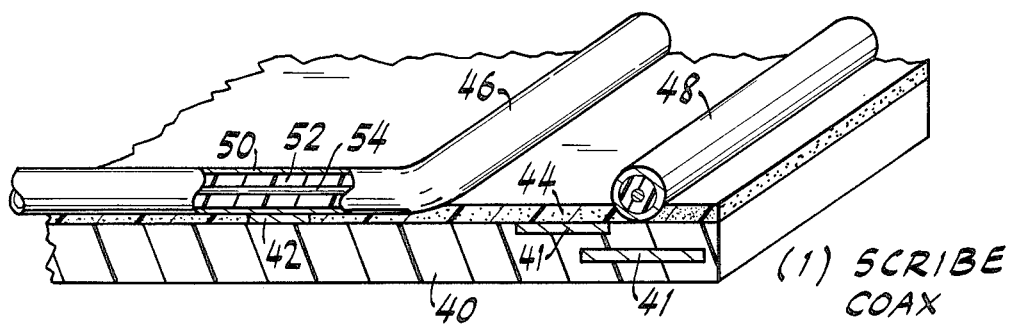
FIG. IA
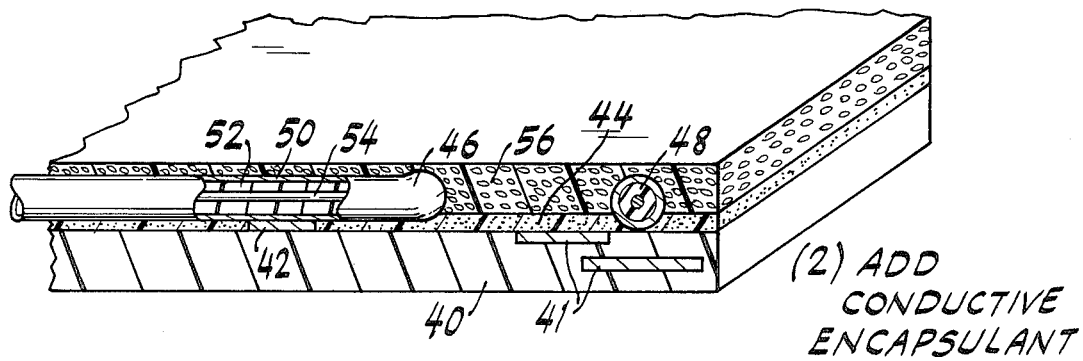
FIG. IB
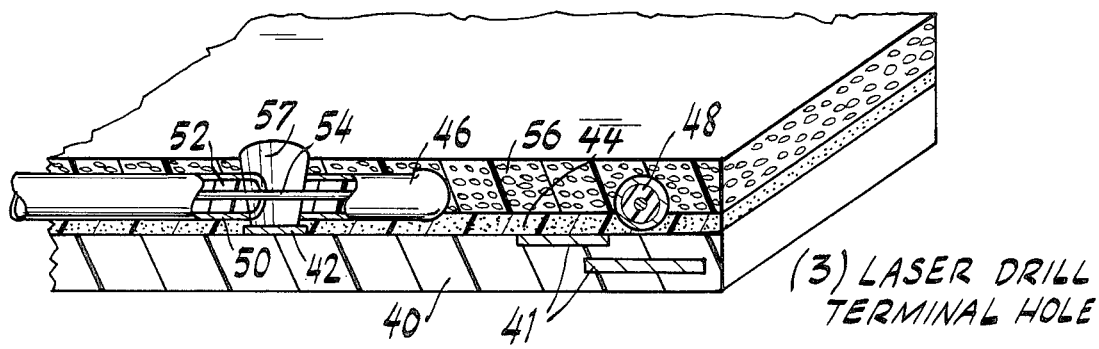
FIG. IC

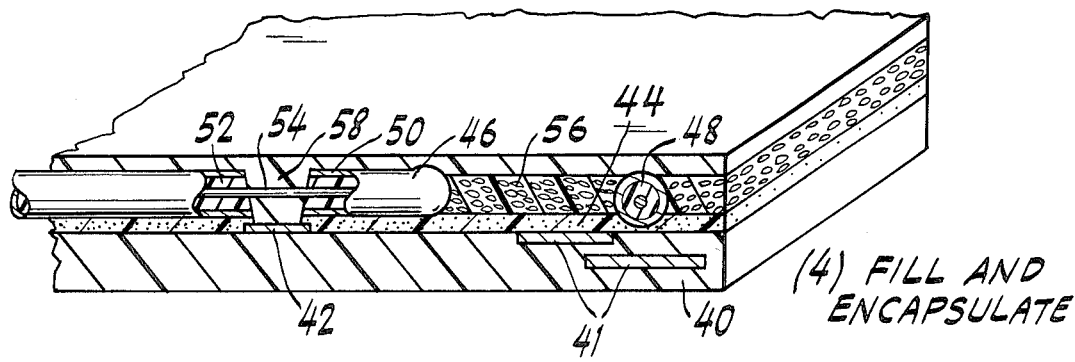
(4) FILL AND ENCAPSULATE
FIG. ID
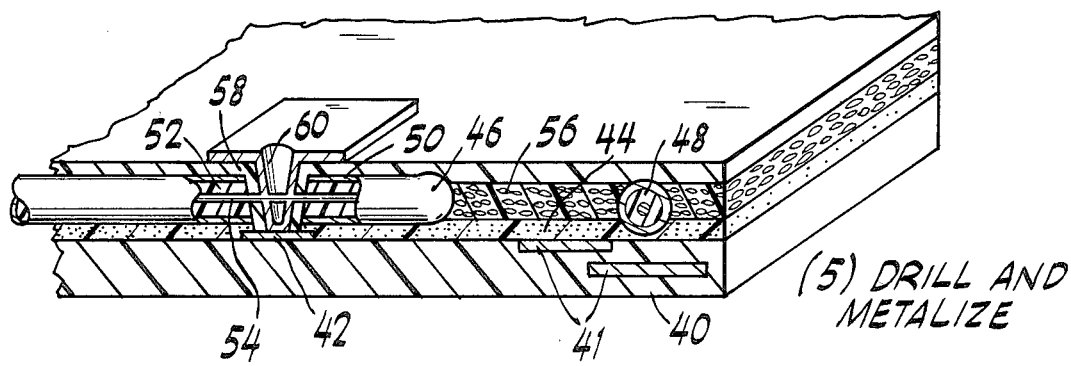
(5) DRILL AND METALIZE
FIG. IE (4) ETCH BACK OF SHIELD (5) FILL (6) DRILL AND METALIZE

4,743,710

COAXIAL INTERCONNECTION BOARDS

BACKGROUND OF THE INVENTION

This invention relates to a wire scribed circuit board product and method of manufacture. Specifically this invention relates to wire scribed circuit boards wherein at least some of the conductors are coaxial conductors.

Coaxial conductors are the preferred transmission medium for high freguency signals, particularly high speed digital signals, in which the signal conductor is protected by a shield which is electrically connected to the reference potential or "ground". A coaxial conductor contains all of the signal energy inside its shield on the signal conductor. The shield isolates the signal conductor from the surrounding environment, thus providing a clean uniform environment for signal travel. The shield prevents radiation of energy from the signal conductor which improves signal propagation and reduces electrical interference which may affect other signals in the vicinity.

Although coaxial conductors are recognized as a preferred interconnect medium where high signal switching speeds are involved, they are not widely used in electrical circuit boards because of the problems incurred in properly terminating the signal conductor at the end points of the coaxial conductor. The signal conductor and shield must be electrically isolated from each other at the terminal points. In manual installations, the signal conductor is usually terminated by stripping back or removing the shield and insulation and connecting it to the terminal point by soldering, welding, or the like. Termination of the shield is conventionally made by connecting a wire, often called a drain wire, between the shield and a central ground point. This approach, however, is not practical where there is a large number of interconnections on a circuit board.

Wire scribed circuit boards can be produced using the method described in U.S. Pat. Nos. 3,671,914 and 3,674,102. In this process an insulated wire is scribed onto an insulating base by feeding a continuous strand of wire onto the surface of the base while simultaneously affixing the wire to the base thereby producing a wire image of a predetermined interconnect pattern. Through holes are subseguently drilled at the terminal points intersecting the end points of the conductors. The holes are then metallized to electrically connect the end points of the conductors to surface terminal pads or later added components.

The above cited patents on methods for manufacture of discrete wire circuit boards broadly describe a method for adhering insulated wire to an insulating base or subsrate and for making terminations at the ends of the conductors. The process, however, does not work if coaxial conductors are used as the interconnect medium since the signal conductor and shield would become electrically connected or shorted" at the terminal points.

In U.S. Pat. No. 3,969,816 "Bonded Wire Interconnection System" by Swengel et al, discrete coaxial conductors are placed at locations on a substrate. Lengths of coaxial conductors are bridged between discrete point locations determined by a matrix apertured substrate. The conductors are anchored within the substrate apertures and the ends then milled flush with the board surface exposing both the shield and the signal conductor. In order to prevent shorting of the signal conductor to the shield at the termination, a ring of dielectric material is placed on the surface, covering the shield. In another embodiment a selective etch (apparently a photo resist with selective activation) is used to recess the shield from the surface plane. The patent also discloses terminal points interconnected by insulated conductors which are metallized to create a shield for the conductors. The conductor termination technigues disclosed in the '816 patent are all based on having conductor terminations flush with the board surface.

SUMMARY OF THE INVENTION

Coaxial conductor interconnection boards according to the invention are made by scribing the coaxial conductors onto the board surface following a predetermined pattern between terminal points, by placing holes in the board at the terminal points, by providing clearance areas at the terminal points free of conductors other than the signal conductors and by selectively connecting the signal conductors to surface terminal pads and/or through holes without shorting to the surrounding shield or ground plane.

According to one embodiment of the invention, preformed coaxial conductors are scribed on a circuit board which is thereafter laser drilled. The coaxial conductors include a shield which is either a thin metallic layer or is of an organic conductor material. After the coaxial conductors have been scribed on the board surface, laser holes are drilled using laser energy at a wavelength not absorbed by the signal conductor. The same laser drilling may also remove the shield material, the coaxial dielectric material and any surrounding encapsulating material, and where necessary, selective etching can be used to remove shield material. The holes are then filled with insulating material to provide insulation at the ends of the shields and a clearance area at the terminal points. The filled holes are then drilled a second time with smaller holes to again expose the signal conductors and these holes may then be metalized to connect the signal conductors to the surface terminations.

Another embodiment of the invention using scribed coaxial conductors utilizes selective etch back of the shield to provide effective clearance areas at the terminal points. After the coaxial conductors are scribed and encapsulated, holes are drilled at the terminal points exposing both the shield and the signal conductor on the hole wall. The shield is then etched back from the wall and the hole filled with an insulating material to provide insulation at the ends of the shield. Selective etching of the shield without affecting the signal conductor is achieved by either using an etch composition which etches the shield material but not the signal conductor, or by electrolytic etching of the shield conductor. The filled, or partially filled, holes are drilled a second time to expose the signal conductors. This hole may then be metalized to bring the signal conductor to a surface termination or to connect to other components.

In either of the embodiments the shields of the coaxial conductors are preferably interconnected by a conductive layer. This layer not only interconnects the shields on the interconnection board, but also forms a ground plane.

DETAILED DESCRIPTION OF THE INVENTION

FIGS. 1A through 1E are à series of sequential illustrations showing a process for making coaxial interconnection boards wherein preformed coaxial conductors are scribed and terminations are made using double laser drilling.

FIGS. 2A to 2F are a series of sequential illustrations showing a process for making coaxial interconnection boards using preformed coaxial conductors and wherein terminations are made by drilling and etching back the shield conductors.

BRIEF DESCRIPTION OF THE DRAWING

FIGS. 1A through 1E describe a sequential process for making coaxial interconnection boards using preformed coaxial conductors. Clearance areas for terminating the coax signal conductors are achieved by double drilling, preferably laser drilling.

Figure 2A:
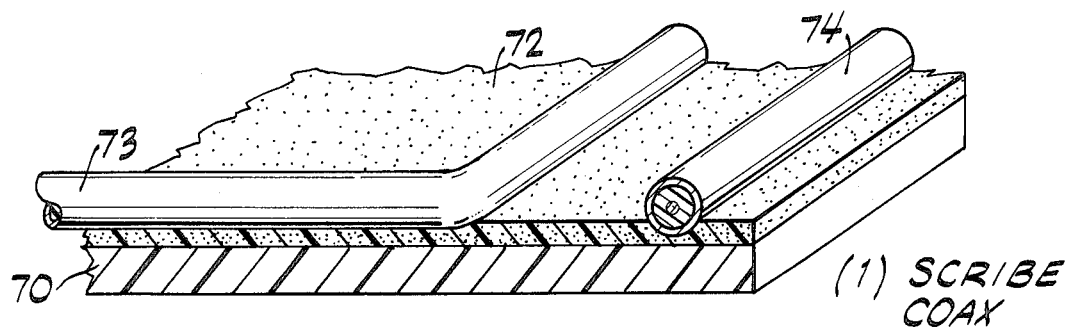
Figure 2B:
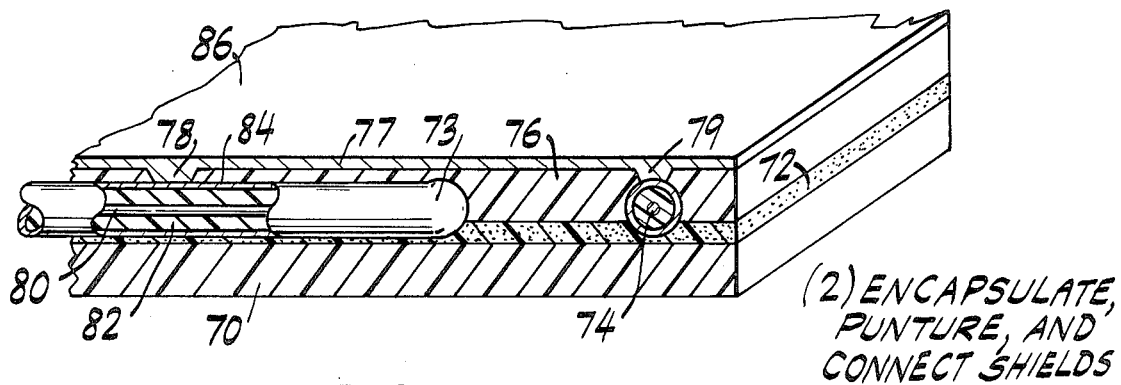

A substrate 40 may be of any known type of interconnection board with or without discrete wiring or interconnections made by graphic technigues. The existing interconnection pattern may be on the surface or may be in the form of interior conductor patterns 41 as shown. The board surface may include small copper bounce pad areas 42 plated thereon in the terminal areas which will be used to reflect laser energy used in making signal conductor terminations.

The substrate surface is coated with an adhesive 44 and preformed coaxial conductors 46 and 48 are then scribed on the adhesive surface. The scribing can be accomplished using the procedure described in Burr U.S. Pat. No. 3,671,914 wherein the board is positioned by an X Y table and the wire is dispensed by a scribing head which activates the adhesive so as to tack the dispensed wire in place on the board. The adhesive layer preferably has thermo set characteristics so that the coaxial conductors can be permanently set after scribing, for example, by oven curing of the adhesive.

The coaxial conductors include copper signal conductor 54 in the center surrounded by insulating layer 52. The signal conductor is preferably silver coated. The insulating material preferably has a high resistance and low dielectric constant such as tetrafluoroethylene (TEFLON). The insulating layer is surrounded with an outer conductive shield which can be of a type removable using laser energy such as (1) a thin vacuum deposited copper layer (2) a thin plated copper layer or (3) an organic conductive material. A suitable organic conductive shield material would be epoxy filled with silver or copper flakes at the ratio of 4 parts metal to 1 part epoxy. A preferred epoxy filled material is EPO-TEK 17 which is a silver flake filled epoxy available from Epoxy Technology Inc.

As shown is FIG. 1B, the board is next encapsulated using a conductive material such as the aforementioned copper or silver flake filled epoxy (approximately 4 parts metal to 1 part epoxy). This conductive encapsulant forms a ground plane which interconnects all of the coaxial shield conductors. The layer is also susceptible of laser drilling using energy from a $CO_2$ laser.

The board is next drilled forming a relatively large hole 57 as shown in FIG. 1C by using a broadly focussed $CO_2$ laser. Encapsulating layer 56, adhesive layer 44, and insulation 52 of the coaxial conductor, are all organic materials which readily absorb $CO_2$ laser energy at 10.6 microns wavelength and, hence, these materials can be vaporized by the application of laser energy. Conductive shield 50 is also vaporized either because it is an organic conductive material or because it is a sufficiently thin copper layer. Signal conductor 54 reflects the $CO_2$ laser energy and is relatively unaffected by the laser beam. Copper bounce pad 42 reflects the laser energy upwardly to vaporize organic material beneath the signal conductor.

As illustrated in FIG. 1D, the board is next encapsulated with a nonconductive epoxy layer 58 which fills hole 57 to provide a clearance area at the terminal point. The clearance area is free of conductive shield material.

The board is then drilled a second time to again expose signal conductor 54. The drilling may be mechanical or, as shown in FIG. 1E, by a narrow focused $CO_2$ laser beam. This hole wall is surrounded by insulating material 58 which isolates the hole from the conductive shield material of the coaxial conductors. The board is then plated to form a terminal pad 60 at the surface and to metallize the hole thereby connecting signal conductor 54 to the surface terminal pad as shown in FIG. 1E.

The procedure described in FIGS. 1A–1E may be modified to include chemical etching which is preferred where a significant guantity of copper is included in either the shield or the ground plane layer interconnecting the shields.

A first such variation, which provides good results with thin vacuum deposited shields and can provide moderately good results with plated or filled epoxy shields, is as follows:

(1) Scribe the coaxial conductor pattern.
(2) Apply laser energy to removed the shield and dielectric material in the termination areas.
(3) Encapsulate the board using a filled epoxy to form a ground plane.
(4) Supply a mask and then selectively etch to remove filled epoxy in the clearance areas at termination points.
(5) Fill the clearance areas with a nonconductive material.
(6) Drill a small hole, preferably using a focussed laser energy to again expose the copper signal conductor in the clearance area.
(7) Metalize the hole to make a terminal connection.

A second such variation includes the following seguence of steps:

(1) Scribe the coaxial conductor pattern.
(2) Plate over the coaxial conductors to provide a copper ground plane interconnecting the coaxial shields.
(3) Mask and selectively etch in the clearance areas at the termination points to remove the plated ground plane and the upper portion of the coaxial shield.
(4) Apply laser energy to remove the dielectric in the clearance area and to expose the signal conductor.
(5) Use additional selective etch if necessary to remove any remaining shield material beneath the signal conductor.
(6) Fill the clearance area with a nonconductive material.
(7) Drill a small hole, preferably using a focussed laser beam to again expose the copper signal conductor in the termination area. (8) Metalize the hole to make a terminal connection.

In both of the variations using selective etching in the clearance areas, the signal conductor should be silver coated. Silver is resistant to most common copper etching solutions and, thus, protects the signal conductor during the etching steps.

Another process for making a coaxial interconnection board using preformed coaxial conductors is sequentially illustrated in FIGS. 2A–2F. In this process the clearance areas at the signal conductor terminations are created by drilling and a selective etch-back of the shield conductors.

As shown in FIG. 2A the substrate 70, which may include interior and/or surface conductors, ground planes or power planes, is coated with an adhesive layer. Coaxial conductors 73 and 74 are scribed on the surface and tacked into position using the procedure generally described in Burr U.S. Pat. No. 3,671,914. The substrate is mounted on an X-Y table and moved relative to a scribing head which dispenses the coaxial conductor. The adhesive is activated as the conductors come into contact with the board surface by applying energy, such as ultrasonic energy through a suitable ultrasonic stylus.

The interconnection board is then encapsulated using a suitable resin 76 and then punctured at selected points to expose the coaxial shields. As can be seen in the cutaway section, signal conductor 80 is surrounded by dielectric 82 which in turn is surrounded by a conductive shield 84. Punctures in the encapsulating layer 76, such as punctures 78 and 79, are preferably made using a CO laser since the laser energy (at about 10.6 microns wavelength) is readily absorbed by the organic resin encapsulating materials but is reflected and not absorbed by the conductive shield 84. Thus, the punctures expose the metallic shield of the coaxial conductors through the encapsulating layer 76. The board is then coated by a conductive layer which fills punctures 78 and 79 so that all of the coaxial shields are connected to a common ground plane 77.

Figure 2C:
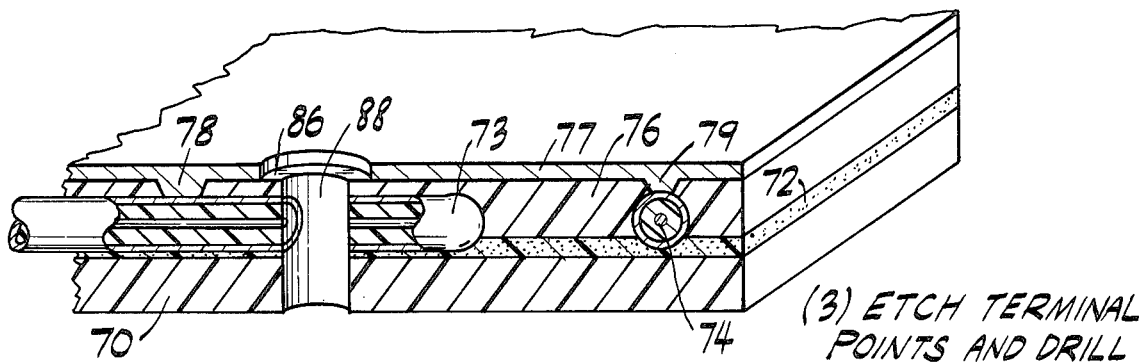

As shown in Fig 2C, the interconnection board is next etched to remove conductive material in the vicinity of the terminal points and is then drilled. Selective etching in the terminal areas can be achieved by coating the board with a photo activatable resist. The resist is activated at the terminal points to permit etching of the conductive layer in these areas to provide clearance areas 86 at the surface. A hole 88 is then drilled at the center of clearance area 86 to expose signal conductor 80 and conductive shield 84 on the wall of the hole.

Figure 2D:
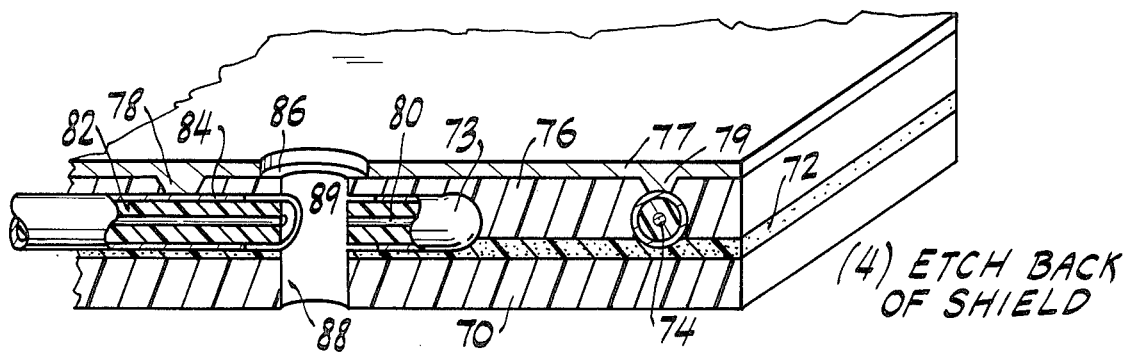
Figure 2E:
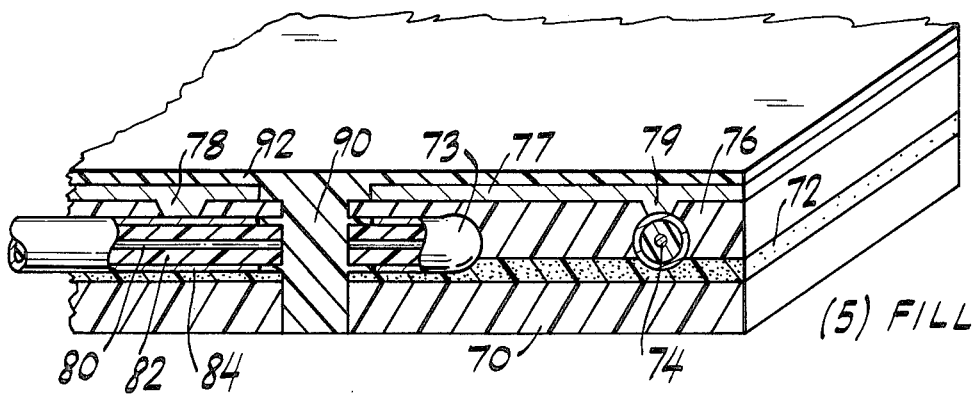

The conductive shield is next etched back away from the hole wall as shown in Fig. 2D. The selective etching can be achieved by using a different conductive material for signal conductor 80 and conductive shield 84 in combination with an etching solution which affects only the shield material. For example, the central signal conductor may be copper and the outer shield conductor aluminum which can be selectively etched using sodium hydroxide as an etchant. Alternatively, the signal conductor may be a noble metal such as gold, silver, or palladium silver, and the shield conductor may be made of copper or other less noble metals. In this case common etchants such as presulfates or ammoniacal copper chloride can be used.

Another method of selectively etching back the outer shield is to use an electrolytic etch. This is particularly convenient since all of the conductive shields on the interconnection board have previously been interconnected to common ground plane 77. The exposed ends of the conductive shields can be electrolytically etched by applying a potential between the ground shield and the etch bath. The signal conductors are not electrically connected and are therefore unaffected by the eletrolytic etching. If the signal conductor and shield conductors are copper, a suitable etch bath is a sulfuric acid copper sulfate solution. Etching is achieved by making the outer shield conductors anodic in the electroetch solution. The selective etching provides the cavities 89 that provide a conductive shield clearance area at the terminal points.

After the shields have been etched back, the board is encapsulated with a non-conductive resin material 92 which provides a cavity filler 90 to fill the hole as well as cavity 89 created by etching back the shield conductors. Preferably the exposed ends of the shield conductors are coated electrophoretically. The circuit board is placed in an electrophoretic suspension and the outer shield conductors electrically charged to cause electrolytic precipitation of insulating material on the charged surfaces. After the electrophoretic step the coating may reguire a thermal exposure to fuse or reflow the material in order to obtain a good seal of the exposed shield conductor ends. Thereafter the board can be dip-coated to fill the holes 90 and to provide an insulating layer 92 on the surface of the board.

Figure 2F:
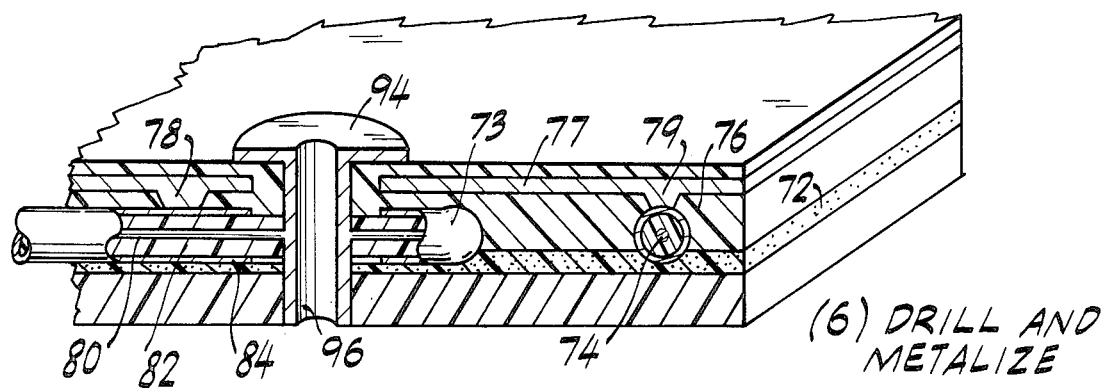

As shown in FIG. 2F the board is then drilled a second time with a hole of the same or slightly larger size maintaining the original hole registry. This hole again exposes the end of the signal conductor. The shield conductors, however, have previously been etched back to provide a clearance area at the terminal point and are therefore not exposed on the hole wall. The hole is then metallized and plated to form a surface pad 94 and a conductive hole wall 96 connecting the signal conductor to the surface pad.

Although specific embodiments have been described for making single sided coaxial interconnection boards, the technigues according to this invention are egually applicable for making interconnection boards with coaxial conductors on both sides or interconnection boards with multi-layered coaxial conductors.

The substrate on which the coaxial conductor pattern is formed may be plain, or may include interconnection conductors formed by discrete wiring, plating or etching. The substrate may also include ground planes, or power planes, either interior or on the surface. The substrate may also include surface conductors, terminal pads or terminal holes. The technigues utilized for signal conductor terminations may be used to bring the signal conductor terminations to the surface or to interconnect with other interior or surface conductors. Furthermore, additional interconnecting layers can be formed over the coaxial conductor layers if desired.

Although preferred layering techniques have been disclosed in each of the respective embodiments, in most cases a layering technigue used in one embodiment may also be employed to form a similar type layer in another embodiment. For example, in both of the embodiments wire is scribed on the board surface. Scribing can be achieved by either placing the adhesive coating on the board surface o by placing the adhesive on the conductor.

In both of the embodiments, the coaxial conductor shields are interconnected by a ground plane layer which may be either plated copper or a copper filled epoxy. Other techniques for forming a conductive layer may also be employed. However, in cases where material is removed by laser drilling, organic conductive materials are preferred. On the other hand, where conductive material is selectively removed by selective etching, the plated layers are preferred.

Although specific chemical techniques have been referred to, these are only illustrative since, in general, any of the technigues employed in the printed circuit and discrete wiring arts can readily be used in making the coaxial interconnection boards according to the invention. For additional information on the "print and etch", "additive", processes for metalizing circuit boards see U.S. Pat. No. 4,504,607 and the prior art discussed therein. For additional discussion on through hole interconnection in circuit boards see application PROCESS FOR BONDING METALS TO ELECTROPHORETICALLY DEPOSITED RESIN COATINGS Ser. No. 632,041 filed 7/18/84 for additional information on photo selective metallization see application FORMATION OF METAL IMAGES USING REDUCIBLE NON-NOBLE SALTS AND LIGHT SENSITIVE REDUCING AGENTS Ser. No. 487,737, filed 7/11/74. For a general reference on common technigues used in making printed circuits see Design Guide: IPC D-330 available from the Institute for Interconnecting and Packaging Electronic Circuits in Evanston, Illinois.

The invention is more particularly defined in the appended claims.

We claim:

1. An improved wire scribed circuit board including an insulating planar substrate, a plurality of terminal points on said board, a conductive ground plane generally parallel to said substrate, at least one thin elongated preformed signal at least one conductor having an insulating coating extending along its length and at least one conductive shield, means for adhering said at least one conductor, said insulating coating and said at least one conductive shield to said surface of the substrate following a predetermined path between selected terminal points of said plurality of terminal points, the improvement comprising:

said at least one signal conductor, said insulating coating and said at least one shield being surface mounted on the planar substrate and said at least one shield extending along the length of the at least one signal conductor substantially surrounding said insulating coating to form a coaxial conductor;

each said selected terminal point of said plurality of terminal points for said at least one signal conductor surrounding nonconductive clearance areas, said at least one shield remaining outside said clearance areas and said at least one signal conductor being terminated within said clearance areas at each said selected terminal point of said plurality of terminal points, and said shield being terminated outside said clearance areas and being electrically connected to said ground plane.

2. A wire scribed circuit board comprising: an insulating planar substrate provided with a conductive ground plane parallel to said substrate; a plurality of terminal points on said circuit board;

at least one elongated preformed signal conductor surrounded by an insulating coating extending along its length and a conductive shield external to said insulating coating to form a coaxial conductor, said coaxial conductor being mounted on the surface of said planar substrate;

each terminal point surrounding by an area which is free of any conductive material other than the conductive material of any said signal conductor communciating with the terminal point;

said ground plane comprising a conductive encapsulating layer for electrically connecting said conductive shield to said grinned plane; and said coaxial conductor being adhered to the surface of said planar substrate following a predetermined path between selected said terminal points and being terminated within said areas free of conductive material other than the conductive material of said at least one signal conductor.

3. A wire scribed circuit board according to claim 2 wherein the clearance areas result from removal of conductive material by etching away conductive material other than conductive material of said at least one signal conductor, at least in part.

4. A wire scribed circuit board according to claim 2 wherein the clearance areas result from removal of conductive material other than conductive material of said at least one signal conductor, at least in part, with laser energy.

5. A wire scribed circuit board according to claim 2 wherein the clearance areas result from removal of conductive material other than conductive material of said at least one signal conductor, at least in part, by drilling and selective etching.

* * * * *